United States Patent
Ohya et al.

(10) Patent No.: US 6,629,833 B1
(45) Date of Patent: Oct. 7, 2003

(54) TRANSPARENT CONDUCTIVE FILM AND TOUCH PANEL

(75) Inventors: Toshiyuki Ohya, Otsu (JP); Tetsuo Shimomura, Otsu (JP); Yozo Yamada, Otsu (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 0 days.

(21) Appl. No.: 09/700,209

(22) PCT Filed: May 17, 1999

(86) PCT No.: PCT/JP99/02555

§ 371 (c)(1),
(2), (4) Date: Nov. 13, 2000

(87) PCT Pub. No.: WO99/59814

PCT Pub. Date: Nov. 25, 1999

(30) Foreign Application Priority Data

May 15, 1998 (JP) .............................. 10-133032
Jun. 1, 1998 (JP) .............................. 10-151599

(51) Int. Cl.$^7$ .................. B32B 15/00; B32B 15/08; B32B 27/08; B32B 27/36
(52) U.S. Cl. .............. 425/458; 428/457; 428/469; 428/480; 428/917; 428/918; 528/287; 528/288; 528/293; 528/294; 528/295; 345/173
(58) Field of Search ............................... 428/457, 458, 428/480, 918, 910, 469, 917; 528/287, 288, 293, 294, 295; 345/173

(56) References Cited

U.S. PATENT DOCUMENTS

| | | | | |
|---|---|---|---|---|
| 4,493,872 A | * | 1/1985 | Funderburk et al. | ........ 427/250 |
| 4,786,767 A | * | 11/1988 | Kuhlman | .................... 200/5 A |
| 4,845,189 A | * | 7/1989 | Rudd et al. | .................. 428/480 |
| 4,921,764 A | * | 5/1990 | Rudd et al. | .................. 264/135 |
| 5,128,206 A | * | 7/1992 | Fiard et al. | .............. 427/412.5 |
| 5,164,248 A | * | 11/1992 | Fleury et al. | ........... 156/244.11 |
| 5,225,273 A | * | 7/1993 | Mikoshiba et al. | ......... 428/212 |
| 5,445,871 A | * | 8/1995 | Murase et al. | .............. 428/213 |
| 5,476,707 A | * | 12/1995 | Fiard et al. | .................. 427/127 |
| 5,955,198 A | * | 9/1999 | Hashimoto et al. | ...... 178/18.03 |
| 6,078,274 A | * | 6/2000 | Inou | ........................ 178/18.01 |
| 6,329,044 B1 | * | 12/2001 | Inoue et al. | ............. 178/18.01 |
| 6,351,068 B2 | * | 2/2002 | Yamazaki et al. | .......... 313/506 |

FOREIGN PATENT DOCUMENTS

| | | | |
|---|---|---|---|
| JP | 58-084849 | * | 5/1983 |
| JP | 60-208239 | | 10/1985 |
| JP | 61-39406 | | 2/1986 |
| JP | 62-114686 | | 5/1987 |
| JP | 62-131416 | | 6/1987 |
| JP | 63-319135 | | 12/1988 |
| JP | 1-009729 | | 1/1989 |
| JP | 2-066809 | | 3/1990 |
| JP | 2-194943 | | 8/1990 |
| JP | 2-276106 | | 11/1990 |
| JP | 6-222352 | | 8/1994 |
| JP | 07-268189 | * | 10/1995 |
| JP | 08-134152 | * | 5/1996 |
| JP | 8-244186 | | 9/1996 |
| JP | 9-234816 | | 9/1997 |
| JP | 10-114008 | | 5/1998 |

* cited by examiner

Primary Examiner—Vivian Chen

(57) ABSTRACT

A transparent conductive film (1) having a transparent plastic film (11) and a transparent conductive thin film (12) formed on at least one side thereof, characterized in that a resin layer (P) containing an ionic group in the range of 20 to 1000 eq/ton is provided between the transparent plastic film and the transparent conductive thin film and the ionic group containing resin has a cross-linked structure. The transparent conductive film has excellent adhesion to other conductive thin films and therefore exhibits excellent durability to input with a pen when used in touch panels.

12 Claims, 1 Drawing Sheet ns of 120 μm or smaller and its lamination with another
TRANSPARENT CONDUCTIVE FILM AND TOUCH PANEL

TECHNICAL FIELD

The present invention relates to transparent conductive films using plastic films and to touch panels using the same. In particular, these films exhibit excellent durability to input with a pen when used in touch panels.

BACKGROUND ART

Transparent conductive films having transparent and low-resistive compound thin films formed on plastic films are widely used for various uses utilizing their conductivity, for example, flat panel displays such as liquid crystal displays and EL displays, transparent electrodes of touch panels, and other uses in the electrical and electronic field.

For transparent conductive thin films, typical examples of those for general use are tin oxide, indium oxide, indium-tin composite oxide, and zinc oxide. For their substrates, various kinds of plastic films have been used, including polyethylene terephthalate.

In recent years, with the diffusion of portable information terminal devices, there has been raised a demand for touch panels having the function to input character with a pen. The transparent conductive films used in the touch panels for input with a pen are required to have the following:

(1) transparent conductive thin films are in strong adhesion to silver paste; and (2) no occurrence of cracks or peeling will be caused in the transparent conductive thin films of the transparent conductive films by pressurization with a pen.

To these requirements, conventional transparent conductive films have the problems as described below.

For the purpose of achieving strong adhesion between silver paste and transparent conductive thin films, baking after the application of silver paste onto the transparent conductive thin films may be carried out at 150° C. or higher temperatures. However, if the ordinary polyethylene terephthalate films are heat treated at 150° C., the films will become cloudy in white by the deposition of oligomers. Therefore, a transparent conductive film has been proposed (JP-A 60-131711), in which a layer produced by the hydrolysis of an organosilicon compound is provided as an oligomer deposition preventing layer on a transparent plastic film and a transparent conductive thin film is further laminated thereon. However, this transparent conductive film requires heat treatment at 150° C. for 10 hours for cross-linking the layer, which has been produced by the hydrolysis of an organosilicon compound, after the film formation of the transparent conductive thin film. For this reason, it results in a crystalline transparent conductive thin film, whereby the etching characteristics of the transparent conductive thin film at the time of touch panel production will be extremely deteriorated and the cost of touch panel production will become high.

In addition, when transparent conductive films are used in the touch panel for input with a pen, a pair of conductive thin films, which are disposed opposite to each other with a spacer interposed therebetween, come together into strong contact with each other by pressurization for input with a pen, so that the occurrence of cracks or peeling will be caused in the thin films, thus leading to some troubles including an increase in electrical resistance and an occurrence of disconnection.

Therefore, a transparent conductive film has been proposed (JP-A 2-66809), in which a transparent conductive thin film is formed on a transparent plastic having a thickness of 120 μm or smaller and its lamination with another transparent substrate is achieved with an adhesive layer. The film, however, has insufficient durability to input with a pen. Further, because of lamination with an adhesive, foreign matter such as dust will be incorporated at the time of lamination, resulting in a transparent conductive film with many optical defects.

There has also been proposed a transparent conductive film (JP Patent No. 2525475), in which the crystalline particle size of indium oxide is made to 0.3 μm or smaller by heating treatment. However, this transparent conductive film becomes a crystalline transparent conductive thin film. For this reason, the etching characteristics of the transparent conductive thin film at the time of touch panel production will be extremely deteriorated and the cost of touch panel production will become high, as described above.

There can further be mentioned, for example, a transparent conductive film (JP-A 64-9729) having a structure in which an aqueous polyester resin is provided between a base film and a conductive later; and a transparent conductive film JP-A 2-279106, in which a thermoplastic polyester-type resin is provided between a base film and a conductive layer.

However, these aqueous polyester resin and thermoplastic polyester-type resin have poor heat resistance because they have no cross-linked structure, and therefore, the occurrence of minute wrinkles will be caused by heat when conductive paste or other materials are baked on the transparent conductive film, thus leading to a deterioration of appearance.

The present invention is directed to the solution of the above conventional troubles, and the first objective thereof is to provide a transparent conductive film with an improvement in durability to input with a pen when used in touch panels, which is achieved by an improvement in the adhesion of a conductive thin film. The second objective thereof is to provide a transparent conductive film in which a transparent conductive thin film can be made into strong adhesion to silver paste when used in touch panels.

BRIEF DESCRIPTION OF THE DRAWINGS

The invention will be better understood by reference to the Disclosure of Invention when taken together with the attached drawings wherein.

DISCLOSURE OF INVENTION

Figure 1:
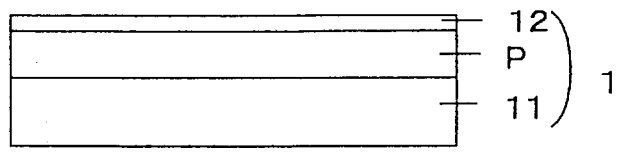
FIG. 1 shows a constitution of layers in the transparent conductive films of Examples 1 to 7.

The present invention was completed in view of these circumstances, and the transparent conductive films and touch panels, which can solve the above problems, are as follows:

That is, the first aspect of the present invention is a transparent conductive film comprising a transparent plastic film and a transparent conductive thin film formed on at least one side thereof, characterized in that a resin layer containing an ionic group in the range of 20 to 1000 eq/ton is provided between the transparent plastic film and the transparent conductive thin film and the ionic group containing resin has a cross-linked structure.

The second aspect is a transparent conductive film characterized in that the ionic group containing resin as set forth in the first aspect is a polyester resin.

The third aspect is a transparent conductive film as set forth in the first or the second aspect, characterized in that the resin layer has a thickness of 0.005 to 0.2 µm.

The fourth aspect is a transparent conductive film as set forth in any of the first to the third aspects, characterized in that the transparent conductive thin film has a surface tension of 35 to 60 dyne/cm.

The fifth aspect is a transparent conductive film as set forth in any of the first to the fourth aspects, characterized in that the adhesion between the transparent conductive thin film and the substrate is 10 g/15 mm or greater.

The sixth aspect is a transparent conductive film as set forth in the fourth or the fifth aspect, characterized in that the transparent conductive thin film is an indium-tin composite oxide thin film and the tin oxide content in the thin film is 10 to 60 wt %.

The seventh aspect is a transparent conductive film as set forth in the first to the sixth aspects, characterized in that a hard coat treatment layer (HC) is provided on one side of the transparent conductive film, which side is in reverse to the other side having the transparent conductive thin film formed thereon.

The eight aspect is a transparent conductive film as set forth in the first to the sixth aspects, characterized in that an anti-glare treatment layer (AG) is laminated on one side of the transparent conductive film, which side is in reverse to the other side having the transparent conductive thin film formed thereon.

The ninth aspect is a transparent conductive film as set forth in the first to the sixth aspects, characterized in that an anti-reflection treatment layer (AR) is laminated on one side of the transparent conductive film, which side is in reverse to the other side having the transparent conductive thin film formed thereon.

The tenth aspect is a transparent conductive film as set forth in any of the first to the ninth aspects, characterized in that the substrate film is a polyester film.

The eleventh aspect is a transparent conductive film as set forth in any of the first to the tenth aspects, characterized in that the transparent conductive thin film is amorphous.

The twelfth aspect is a touch panel comprising a pair of panel sheets having the transparent conductive thin films, which panel sheets are disposed so that the transparent conductive thin films are opposite to each other with a spacer interposed therebetween, characterized in that at least one of the panel sheets comprises any of the transparent conductive films as set forth in any of the first to the eleventh aspects.

The thirteenth aspect is a touch panel as set forth in the twelfth aspect, characterized in that the number of times for durability of the touch panel to input with a pen is 100,000 times or more.

The following will describe the present invention in detail.

The transparent plastic film in the present invention refers to a film formed by melt extrusion or solution extrusion of an organic polymer, and if necessary, subjected to subsequent drawing in the machine direction and/or in the transverse direction, cooling, and thermal fixation. For the organic polymer, there can be mentioned polyethylene, polypropylene, polyethylene terephthalate, polyethylene-2,6-naphthalate, polypropylene terephthalate, nylon 6, nylon 4, nylon 66, nylon 12, polyimides, polyamide-imides, polyethersulfone, polyether ether ketones, polycarbonates, polyarylates, cellulose propionate, polyvinyl chloride, polyvinyl vinylidene, polyvinyl alcohol, polyether imides, polyphenylene sulfide, polyphenylene oxide, polystyrene, syndiotactic polystyrene, and norbornene-type polymers. These organic polymers may be copolymerized or blended with small amounts of other organic polymers. Among these, polyethylene terephthalate, polypropylene terephthalate, polyethylene-2,6-naphthalate, syndiotactic polystyrene, and norbornene-type polymers are most preferably used. More preferred is polyethylene terephthalate.

The transparent plastic film in the present invention has a thickness preferably in the range of greater than 10 µm to 300 µm or smaller with particularly preferred being in the range of 70 to 260 µm. When the thickness is 10 µm or smaller, it results in a shortage of mechanical strength, and in particular, deformation to input with a pen when used in touch panels will become too large, thus leading to insufficient durability. In contrast, when the thickness is greater than 300 µm, it requires that a load at the time of input with a pen when used in touch panels should be made large, which case is not preferred.

The plastic film in the present invention may be subjected to surface treatment such as corona discharge treatment or glow discharge treatment, so long as the treatment is not harmful to the objective of the present invention.

The present invention is characterized in that in a transparent conductive film comprising a plastic film and a transparent conductive thin film formed on at least one side thereof, a resin layer containing an ionic group in the range of 20 to 1000 eq/ton is provided between the plastic film and the transparent conductive thin film and the ionic group containing resin has a cross-linked structure. When the amount of ionic group contained is smaller than 20 eq/ton, it results in a deterioration of adhesion. When the amount is greater than 1000 eq/ton, it results in a deterioration of resistance to wet heat and other characteristics. Further, in cases where the resin has no cross-linked structure, there may occur a shortage of heat resistance.

In the present invention, coating with an ionic group containing resin remarkably improves the adhesion between the transparent conductive thin film and the plastic film. For this reason, when the transparent conductive film of the present invention is used in touch panels, no occurrence of cracks or peeling will be caused in the transparent conductive thin film by pressurization with a pen, which makes it possible to provide touch panels exhibiting excellent durability to input with a pen. The ionic group containing resin has excellent characteristics, even for heat and chemical resistance, because of its cross-linked structure. For the ionic group containing resin of the present invention, for example, polyester resins, acrylic resins, urethane resins, melamine resins, methacrylic resins, urethane acrylic resins, silicone acrylic resins, melamine resins, and polysiloxane resins are preferred. Among these, polyester resins are preferred from the viewpoint of their productivity.

The polyester resins used as substrates for transparent conductive thin films are composed of polyvalent carboxylic acids and polyhydric alcohols. For the polyvalent carboxylic acids used in the polyester resins, there can be exemplified, for example, aromatic dicarboxylic acids such as terephthalic acid, isophthalic acid, ortho-phthalic acid, 1,5-naphthalenedicarboxylic acid, 2,6-naphthalenedicarboxylic acid, diphenic acid, sulfo-terephthalic acid, 5-sulfo-isophthalic acid, 4-sulfo-phthalic acid, 4-sulfo-naphthalene-2,7-dicaboxylic acid, 5-[4-sulfo-phenoxy]-isophthalic acid, sulfo-terephthalic acid, and/or their metal salts or ammonium salts; aromatic oxydicarboxylic acids such as p-oxybenzoic acid and p-(hydroxyethoxy)benzoic acid; aliphatic dicarboxylic acids such as succinic acid, adipic acid, azelaic acid, sebacic acid, and dodecanedicarboxylic acid; unsaturated aliphatic and alicyclic dicarboxylic acids such as fumaric acid, maleic acid, itaconic acid, hexahydrophthalic acid, and tetrahydrophthalic acid. For the polyvalent carboxylic acids, there can also be exemplified polyvalent carboxylic acids having a valence of three or higher, such as trimellitic acid, trimesic acid, and pyromellitic acid.

For the polyhydric alcohols used in the polyester resins, there can be exemplified aliphatic polyhydric alcohols, alicyclic polyhydric alcohols, and aromatic polyhydric alcohols.

For the aliphatic polyhydric alcohols, there can be exemplified aliphatic diols such as ethylene glycol, propylene glycol, 1,3-propanediol, 2,3-butanediol, 1,4-butanediol, 1,5-pentanediol, 1,6-hexanediol, neopentyl glycol, diethylene glycol, dipropylene glycol, 2,2,4-trimethyl-1,3-pentanediol, polyethylene glycol, polypropylene glycol, and polytetramethylene glycol; triols and tetrols such as trimetylolethane, trimetylolpropane, glycerin, and pentaerythritol.

For the alicyclic polyhydric alcohols, there can be exemplified 1,4-cyclohexanediol, 1,4-cyclohexanedimethanol, spiro glycol, hydrogenated bisphenol A, ethylene oxide adducts and propylene oxide adducts of hydrogenated bisphenol A, tricyclodecanediol, and tricyclodecanedimethanol.

For the aromatic polyhydric alcohols, there can be exemplified paraxylene glycol, meta-xylene glycol, ortho-xylene glycol, 1,4-phenylene glycol, ethylene oxide adducts of 1,4-phenylene glycol, bisphenol A, ethylene oxide adducts and propylene oxide adducts of bisphenol A.

Further, for the polyester polyols, there can be exemplified lactone-type polyester polyols obtained by the ring opening polymerization of lactones such as ε-caprolactone.

In addition to these monomers, there are cases where monofunctional monomers are introduced into the polyesters for the purpose of blocking the polar groups at the termini of the polyester polymers.

For the monofunctional monomers, there can be used monocarboxylic acids such as benzoic acid, chlorobenzoic acid, bromobenzoic acid, parahydroxybenzoic acid, sulfobenzoic acid monoammonium salt, sulfo-benzoic acid monosodium salt, cyclohexylaminocarbonylbenzoic acid, n-dodecyl-aminocarbonylbenzoic acid, tert-buylbenzoic acid, naphthalenecarboxylic acid, 4-methylbenzoic acid, 3-methylebnzoic acid, salicylic acid, thiosalicylic acid, phenylacetic acid, acetic acid, propionic acid, butyric acid, isobutyric acid, octanecarboxylic acid, lauric acid, stearic acid, and their lower alkyl esters; or mono-alcohols such as aliphatic alcohols, aromatic alcohols, and alicyclic alcohols.

In the present invention, unsaturated monomers of these monomers are used as the essential components, and the other components are appropriately selected depending upon the glass transition temperatures of polyester resins, their compatibility with monomers, and other factors.

For the ionic groups introduced into the polyesters, there can preferably be used mono- or dicarboxylic acids having sulfonic acid alkali metal salt groups or sulfonic acid ammonium salt groups, and there can also be used, for example, monomers having carboxylic acid alkali metal salt groups or carboxylic acid ammonium salt groups, monomers having anionic groups such as sulfonic acid groups, phosphoric acid groups, phosphonic acid groups, phosphinic acid groups, or their ammonium salt groups or meal salt groups, or monomers having cationic groups such as primary, secondary, or tertiary amine groups.

In cases where carboxylic acid alkali metal salt groups or carboxylic acid ammonium salt groups are introduced, methods can be used, in which carboxyl groups are added to the termini of polymers by the introduction of polyvalent carboxylic acids such as trimellitic acid into the system in the last stage of polyester polymerization, and then converted into carboxylic acid salt groups by neutralization with ammonia or sodium hydroxide.

The polyester resins can further contain mono- or dicarboxylic acids having sulfonic acid alkali metal salt groups or sulfonic acid ammonium salt groups to introduce these ionic groups thereinto. For the salts, there can be mentioned ammonium-type ions, and salts of Li, Na, K, Mg, Ca, Cu, Fe, or other metals with particularly preferred being K salts or Na salts. In the present invention, 5-sodium sulfoisophthalic acid or meta-sodium sulfo-benzoic acid is preferably used. The groups of carboxylic acid salts and the groups of sulfonic acids salts may also be used.

More specific examples of the polyester resins in the present invention are the following polyester resins. There can be exemplified:

polyester resins obtained from a) polyvalent carboxylic acids containing 80 mol % or more aromatic monomers, and b) 0 to 90 mol % ethylene glycol and 100 to 10 mol % propylene glycol; or polyester resins obtained from a) polyvalent carboxylic acids containing 80 mol % or more aromatic monomers, and b) 5 to 80 mol % 2,3-butane diol and 95 to 20 mol % ethylene glycol; or polyester resins obtained from a) polyvalent carboxylic acids containing 80 mol % or more aromatic monomers, b) 70 to 95 mol % $C_2$ to $C_4$ aliphatic glycols, and c) 5 to 30 mol % mono- or polyhydric alcohols having a tricyclodecane basic structure; or polyester resins obtained from a) polyvalent carboxylic acids containing 80 mol % or more aromatic monomers, b) 70 to 95 mol % $C_2$ to $C_4$ aliphatic glycols, and c) 5 to 30 mol % hydroxymethyltricyclodecane; or polyester resins obtained from a) polyvalent carboxylic acids containing 80 mol % or more aromatic monomers, b) 70 to 95 mol % $C_2$ to $C_4$ aliphatic glycols, and c) 5 to 30 mol % tricyclodecanedimethanol; or polyester resins obtained from a) polyvalent carboxylic acids containing 80 mol % or more aromatic monomers, b) 70 to 95 mol % $C_2$ to $C_4$ aliphatic glycols, and c) 5 to 30 mol % mono- or polyhydric alcohols having a cyclohexane basic structure; or polyester resins obtained from a) polyvalent carboxylic acids containing 80 mol % or more aromatic monomers, b) 70 to 95 mol % $C_2$ to $C_4$ aliphatic glycols, and c) 5 to 30 mol % cyclohexanediol; or polyester resins obtained from a) polyvalent carboxylic acids containing 80 mol % or more aromatic monomers, b) 70 to 95 mol % $C_2$ to $C_4$ aliphatic glycols, and c) 5 to 30 mol % hydrated biphenol; or polyester resins obtained from a) polyvalent carboxylic acids containing 80 mol % or more aromatic monomers, b) 70 to 95 mol % $C_2$ to $C_4$ aliphatic glycols, and c) 5 to 30 mol % hydrated bisphenol A; or polyester resins obtained from a) polyvalent carboxylic acids containing 80 mol % or more aromatic monomers including 1 to 20 mol % mono- or at least bivalent carboxylic acids having a naphthalene basic structure, b) 70 to 100 mol % $C_2$ to $C_4$ aliphatic glycols, and c) 0 to 30 mol % alicyclic monomers.

Further, "a) aromatic monomers" as indicated herein are preferably terephthalic acid or isophthalic acid. The ratio of terephthalic acid to isophthalic acid is preferably set to terephthalic acid content/isophthalic acid content=90 to 40/10 to 60 [mol %], more preferably terephthalic acid content/isophthalic acid content=80 to 50/20 to 50 [mol %], and still more preferably terephthalic acid content/isophthalic acid content=85 to 60/15 to 40 [mol %].

When ionic group containing monomers are introduced into the polyester resin to give the ionic groups to the polyester resin, the adhesion to the transparent conductive thin film will become strong. For the ionic group containing monomers, there can preferably be used mono- or dicarboxylic acids having sulfonic acid alkali metal salt groups or sulfonic acid ammonium salt groups as described above, and there can also be used, for example, monomers having carboxylic acid alkali metal salt groups or carboxylic acid ammonium salt groups, monomers having anionic groups such as sulfonic acid groups, phosphoric acid groups, phosphonic acid groups, phosphinic acid groups, or their ammonium salt groups or meal salt groups, or monomers having cationic groups such as primary, secondary, or tertiary amine groups.

In cases where carboxylic acid alkali metal salt groups or carboxylic acid ammonium salt groups are introduced, methods can be used, in which carboxyl groups are added to the termini of polymers by the introduction of polyvalent carboxylic acids such as trimellitic acid into the system in the last stage of polyester polymerization, and then converted into carboxylic acid salt groups by neutralization with ammonia or sodium hydroxide.

The amount of these ionic groups contained, including sulfonic acid groups and/or salt groups thereof, is 20 to 1000 eq/ton, preferably 20 to 500 eq/ton, and particularly preferably 50 to 200 eq/ton, relative to the polyester resin. When the amount is smaller than 20 eq/ton, it results in a deterioration of adhesion. When the amount is greater than 1000 eq/ton, it results in a deterioration of resistance to wet heat and other characteristics. Further, in cases where the resin has no cross-linked structure, there may occur a shortage of heat resistance.

In addition, the coating thickness of the ionic group containing resin in the resent invention is preferably 0.005 to 0.2 μm for the purpose of further improving adhesion, with more preferred being 0.01 to 0.15 μm. When the coating thickness is greater than 0.2 μm, it results in a deterioration of adhesion. In contrast, when the coating thickness is smaller than 0.005 μm, it is difficult to give a continuous film, thus leading to a shortage of the adhesion of a transparent conductive thin film.

The formation of an ionic group containing resin makes it possible to bring the adhesion between the transparent conductive thin film and the substrate to 10 g/15 mm or greater.

To laminate a resin containing an ionic group in the range of 20 to 1000 eq/ton of the present invention on a transparent plastic film, the lamination is achieved using a coating method to the transparent plastic film. For the coating method, there can be used air doctor coat methods, knife coat methods, rod coat methods, forward rotation roll methods, reverse roll coat methods, gravure coat methods, kiss coat methods, bead coat methods, slit orifice coat methods, cast coat methods, or other methods. To give a cross-linked structure, energy is applied by heating or by irradiation of ultraviolet rays or electron beams after the coating.

To laminate an ionic group containing resin on a transparent plastic film that is subjected to drawing in the machine direction and in the transverse direction, cooling, and thermal fixation, methods may be applied, in which coating is carried out between two drawing steps, i.e., between the drawing in the machine direction and the drawing in the transverse direction in the biaxial drawing procedures.

Prior to the coating of a hardenable polymer, the transparent plastic film may be subjected to surface treatment such as corona discharge treatment or glow discharge treatment, so long as the treatment is not harmful to the objective of the present invention.

For the transparent conductive thin film in the present invention, it is not particularly limited, so long as it is a material having both transparency and conductivity, typical examples of which are thin films of indium oxide, zinc oxide, tin oxide, indium-tin composite oxide, tin-antimony composite oxide, zinc-aluminum composite oxide, and indium-zinc composite oxide. These compound thin films have been known to become transparent conductive thin films having both transparency and conductivity by selecting appropriate conditions for their formation. Among these, indium-thin composite oxide is preferred.

The transparent conductive thin film may desirably have a thickness in the range of 40 to 8000 Å, more desirably 50 to 5000 Å. When the transparent conductive thin film has a thickness of smaller than 40 Å, it is difficult to give a continuous thin film, failing to exhibit good conductivity. In contrast, when the transparent conductive thin film has a thickness of greater than 8000 Å, it results in a deterioration of transparency.

As the method for the formation of a transparent conductive thin film in the present invention, there have been known vacuum deposition methods, sputtering methods, CVD methods, ion plating methods, spray methods, and other methods. Suitable methods can be used depending upon the kinds of the above materials and the necessary film thickness.

For example, in case of sputtering methods, there are used ordinary sputtering methods using compounds, or reactive sputtering methods using metal targets. At that time, oxygen, nitrogen, water vapor, or any other gas may be introduced as a reactive gas; or ozone addition, ion assist, or other means may also be used in combination. Further, bias such as direct current, alternate current, or high-frequency current may be applied to the substrate.

To obtain an amorphous transparent conductive thin film, the temperature for the formation of a plastic film as the substrate should be set to 100° C. or lower, and in addition, the heating after the formation of the transparent conductive thin film should be set to 130° C. or lower. The same is the case with deposition methods, CVD methods, and other formation methods.

It has been found that adhesion properties to silver paste becomes strong by the surface tension of the thus formed transparent conductive thin film ranging from 35 to 60 dyne/cm, making it possible to give the strong adhesion between the silver paste and the transparent conductive thin film even at a baking temperature of about 120° C. When the transparent conductive thin film has a surface tension of smaller than 35 dyne/cm, the baking temperature of 120° C. only gives insufficient adhesion properties to silver paste. In contrast, when the transparent conductive thin film has a surface tension of greater than 60 dyne/cm, it results in an increase in the amount of adsorbed water such as moisture on the transparent conductive thin film, which also gives insufficient adhesion properties to silver paste.

Therefore, to achieve the surface tension of a transparent conductive thin film ranging from 35 to 60 dyne/cm, various methods are used, in which the surface of the transparent conductive thin film is activated by treatment with an acidic or alkaline solution, or by irradiation of ultraviolet rays or electron beams, or by corona treatment or plasma treatment.

The acid used in the washing with an acidic aqueous solution may preferably be hydrochloric acid, sulfuric acid, hydrofluoric acid, nitric acid, or other acids in independent form or in admixture. The alkali used in the washing with an alkaline aqueous solution may preferably be sodium hydroxide, potassium hydroxide, sodium carbonate, calcium hydroxide, or other alkalis in independent form or in admixture.

Alternatively, washing solutions containing these acidic or alkaline ingredients may also be used.

Further, a transparent conductive thin film having a high surface tension can be obtained by irradiation of ultraviolet rays with a low-pressure or high-pressure mercury lump to convert oxygen in the air into active oxygen which reacts with the surface of the transparent conductive thin film. The dose of ultraviolet rays at that time is preferably in the range of 5 to 2000 $mJ/cm^2$. Doses lower than 5 $mJ/cm^2$ cannot give an activated surface, whereas doses higher than 2000 $mJ/cm^2$ require too much time for treatment, both of which cases are not preferred from an industrial point of view.

For the electron beam source used in the electron beam irradiation, there may preferably be used, for example, those of the hot cathode type, field emission type, or cold cathode type as the electron generation system, or those of the Cockcroft-Walton type, potential transformer rectification type, or Van de Graaff type as the high voltage generation system. For the energy of electron beams, it may preferably be in the range of 50 KeV to 30 MeV. Energy lower than 50 KeV only gives insufficient effects of activation on the surface of a transparent conductive thin film, whereas electron beam sources having energy higher than 30 MeV are very expensive and are therefore difficult to give favorable effects from an industrial point of view. The irradiation dose may preferably be in the range of 0.1 to 500 Mrad. Irradiation doses lower than 0.1 Mrad only give insufficient effects of activation on the surface of a transparent conductive thin film, whereas irradiation doses higher than 500 Mrad require too much time for irradiation and are therefore difficult to give favorable effects from an industrial point of view.

Further, materials having high surface tension may be used for the transparent conductive thin film. For example, in the indium-tin composite oxide thin film which is preferably used as the transparent conductive thin film, higher tin oxide contents make it possible to give increased surface tension. The tin oxide content in the indium-tin composite oxide thin film may preferably be 10 to 60 wt %, more preferably 15 to 50 wt %. When the tin oxide content is lower than 10 wt %, it is not possible to bring surface tension in the range of 30 to 60 dyne/cm unless the above activation treatment is used in combination. In case of contents higher than 60 wt %, it results in a thin film having insufficient conductivity.

In the present invention, on the side of the transparent conductive film, on which side the transparent conductive thin film is not formed, hard coat treatment layers (HC), anti-glare treatment layers (AG), anti-reflection treatment layers (AR), and other layers may be laminated.

On one side of the transparent conductive film, which side is in reverse to the other side having the transparent conductive thin film formed thereon, a hard coat treatment layer (HC) may be provided for the purpose of preventing damage from some pens or other means when used in touch panels. For the hard coat treatment layer (HC), hardened layers of cross-linkable resins are preferred, which are made of hardenable resins in independent form or in admixture, such as polyester resins, urethane resins, acrylic resins, melamine resins, epoxy resins, silicone resins, or polyimide resins.

The hard coat treatment layer (HC) may preferably have a thickness in the range of 1 to 50 $\mu$m, more preferably 2 to 30 $\mu$m. When the thickness is smaller than 1 $\mu$m, the hard coat treatment does not exhibit a sufficient function. When the thickness is greater than 50 $\mu$m, the rate of resin coating becomes remarkably low, which is difficult to give favorable effects from the viewpoint of productivity.

As the method for laminating a hard coat treatment layer (HC), the above resin is coated in the gravure system, reverse system, dye system, or any other system on one side of a transparent conductive film, which side is in reverse to the other side having a transparent conductive thin film formed thereon, followed by application of energy such as heat, ultraviolet rays, or electron beams to cause the hardening of the resin.

For the purpose of improving the visual recognition of touch panels, an anti-glare treatment layer (AG) may be provided on one side of a transparent conductive film, which side is in reverse to the other side having a transparent conductive thin film formed thereon.

The formation of an anti-glare treatment layer (AG) involves coating a hardenable resin, and after drying, giving unevenness on the surface of the coating layer by embossing rolls, embossing films, or other means, followed by application of energy such as heat, ultraviolet rays, or electron beams to cause the hardening of the resin. For the hardenable resin, various resins may be used in independent form or in admixture, preferably including polyester resins, urethane resins, acrylic resins, melamine resins, epoxy resins, silicone resins, and polyimide resins.

On one side of a transparent conductive film, which side is in reverse to the other side having a transparent conductive thin film formed thereon, an anti-reflection treatment layer (AR) may be provided for the purpose of further improving the transmittance of visible light when used in touch panels. For this anti-reflection treatment layer (AR), lamination of a single layer, or two or more layers, is preferred, which layer or layers are made of a material or materials having a different refractive index(es) from the refracive index of a plastic film. In case of a single layer structure, there may be used a material having a smaller refractive index that that of the plastic film. In case of a multi-layer structure with two or more layers, for the layer adjacent to the plastic film, there may be used a material having a greater refractive index than that of the plastic film, and for the other layers above the layer of this material, there may be selected from materials having smaller refractive indexes than that refractive index. For the materials constituting such an anti-reflection treatment layer (AR), they are not particularly limited, so long as they meet the relations between the refractive indexes as described above, whether they are organic materials or inorganic materials, but it is preferred to use, for example, dielectrics such as $CaF_2$, $MgF_2$, $NaAlF_4$, $SiO_2$, $ThF_4$, $ZrO_2$, $Nd_2O_3$, $SnO_2$, $TiO_2$, $CeO_2$, ZnS, and $In_2O_3$.

For this anti-reflection treatment layer (AR), there may be used dry coating processes such as vacuum deposition methods, sputtering methods, CVD methods or ion plating methods, or wet coating processes such as those of the gravure system, reverse system or dye system.

Further, prior to the lamination of such a hard coat treatment layer (HC), an anti-glare treatment layer (AG), and/or an anti-reflection treatment layer (AR), corona discharge treatment, plasma treatment, sputter etching treatment, electron beam irradiation treatment, ultraviolet ray irradiation treatment, primer treatment, easy adhesion treatment, or other well known treatments may be subjected as a pre-treatment.

Figure 5:
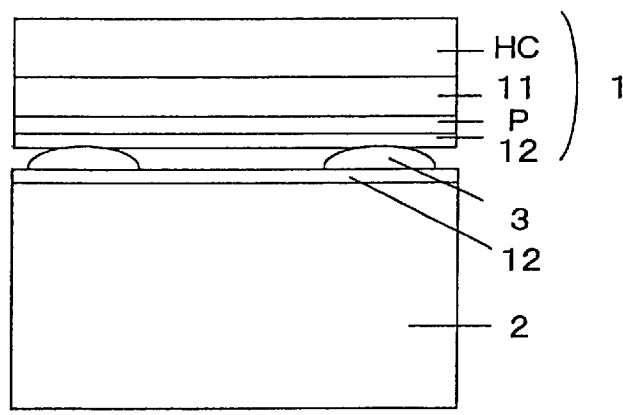
FIG. 5 shows a section of a touch panel utilizing a transparent conductive film of this invention.

FIG. 5 shows an example of the touch panel using the transparent conductive film of the present invention.

In the touch panel that has a pair of panel sheets having transparent conductive thin films disposed with a spacer interposed therebetween so that the transparent conductive thin films are opposite to each other, the transparent conductive film of the present invention is used for one of the panel sheets. When this touch panel is used to input characters with a pen from the side of the transparent conductive film, the opposite transparent conductive thin films are brought into contact with each other by pressurization with a pen to bring electrically the state "ON", whereby the position of the pen on the touch panel can be detected. The continuous and accurate detection of this pen position makes it possible to input the characters by the trace of the pen. In this case, since the panel sheet on the side of pen touch is the transparent conductive film of the present invention, excellent durability to input with a pen can be exhibited, making the touch panel stable over a long period of time.

In FIG. 5, the other panel sheet has a transparent substrate, which is made of a plastic film or a glass sheet, and a transparent conductive thin film laminated thereon, and the transparent conductive film of the present invention may be used therefor.

SPECIFIC EXAMPLES

The present invention will be further illustrated below by reference to Examples and Comparative Examples; however, the present invention is not limited to the following Examples.

Example 1

A polyester resin (VYLON RV280 available from Toyobo Co., Ltd.; the amount of ionic group, 120 eq/ton) and an isocyanate cross-linking agent (CORONATE L available from Nippon Polyurethane Industry Co., Ltd.) were mixed with methyl ethyl ketone and toluene as solvents in the mixing ratio shown in Table 1 to give a coating solution. The coating solution prepared was then coated on a polyester resin film (COSMOSHINE A4350 available from Toyobo Co., Ltd.) of 188 $\mu$m in thickness by the bar coat method. Wire bar No. 3 was used. The coated film was subjected to heat treatment at 130° C. for 30 minutes. The coating thickness was 0.3 $\mu$m.

On the coating side of the coated plastic film, an indium-tin composite oxide thin film of 250 Å in thickness having 5 wt % tin oxide content was formed as a transparent conductive thin film by the DC magnetron sputtering method using an indium-tin composite oxide as a target. At that time, the degree of vacuum was set to $1\times10^{-3}$ Torr, and Ar and $O_2$ gases were flowed at 60 and 2 sccm, respectively. During the film formation, the temperature of the substrate film was set to 5° C. The electric power applied to the target was set to 1.5 W/cm$^2$.

This transparent conductive film was used as one of the panel sheets, and a sheet having a glass substrate and a transparent conductive thin film of 400 Å in thickness, which had been formed on the glass substrate by the same method as described above, was used as the other panel sheet. These two panel sheets were disposed with epoxy beads of 30 $\mu$m in diameter interposed therebetween so that the transparent conductive thin films were opposite to each other, giving a touch panel.

Example 2

A polyester resin (VYLON RV280 available from Toyobo Co., Ltd.; the amount of ionic group, 50 eq/ton) and an isocyanate cross-linking agent (CORONATE L available from Nippon Polyurethane Industry Co., Ltd.) were mixed with methyl ethyl ketone and toluene as solvents in the mixing ratio shown in Table 1 to give a coating solution. The coating solution prepared was then coated on a polyester resin film (COSMOSHINE A4350 available from Toyobo Co., Ltd.) of 188 $\mu$m in thickness by the bar coat method. Wire bars Nos. 3 and 6 were used. The coated films were subjected to heat treatment at 130° C. for 30 minutes. The coating thickness was 0.12 or 0.25 $\mu$m.

On the coating side of each of the coated plastic films, an indium-tin composite oxide thin film of 250 Å in thickness having 5 wt % tin oxide content was formed as a transparent conductive thin film by the DC magnetron sputtering method using an indium-tin composite oxide as a target. At that time, the degree of vacuum was set to $1\times10^{-3}$ Torr, and Ar and $O_2$ gases were flowed at 60 and 2 sccm, respectively. During the film formation, the temperature of the substrate film was set to 5° C. The electric power applied to the target was set to 1.8 W/cm$^2$.

Each of these transparent conductive films was used as one of the panel sheets, and a sheet having a glass substrate and a transparent conductive thin film of 400 Å in thickness, which had been formed on the glass substrate by the same method as described above, was used as the other panel sheet. These two panel sheets were disposed with epoxy beads of 30 $\mu$m in diameter interposed therebetween so that the transparent conductive thin films were opposite to each other, giving a touch panel.

Example 3

A polyester resin (VYLON RV285 available from Toyobo Co., Ltd.; the amount of ionic group, 340 eq/ton) and an isocyanate cross-linking agent (CORONATE L available from Nippon Polyurethane Industry Co., Ltd.) were mixed with methyl ethyl ketone and toluene as solvents in the mixing ratio shown in Table 1 to give a coating solution. The coating solution prepared was then coated on a polyester resin film (COSMOSHINE A4350 available from Toyobo Co., Ltd.) of 188 $\mu$m in thickness by the bar coat method. Wire bar No. 3 was used. The coated film was subjected to heat treatment at 130° C. for 30 minutes. The coating thickness was 0.12 $\mu$m.

On the coating side of the coated plastic film, an indium-tin composite oxide thin film of 300 Å in thickness having 10 wt % tin oxide content was formed as a transparent conductive thin film by the DC magnetron sputtering method using an indium-tin composite oxide as a target. At that time, the degree of vacuum was set to $1\times10^{-3}$ Torr, and Ar and $O_2$ gases were flowed at 60 and 2 sccm, respectively. During the film formation, the temperature of the substrate film was set to 20° C. The electric power applied to the target was set to 1.5 W/cm$^2$.

This transparent conductive film was used as one of the panel sheets, and a sheet having a glass substrate and a transparent conductive thin film of 400 Å in thickness, which had been formed on the glass substrate by the same method as described above, was used as the other panel sheet. These two panel sheets were disposed with epoxy beads of 30 μm in diameter interposed therebetween so that the transparent conductive thin films were opposite to each other, giving a touch panel.

Example 4

Apolyester resin (VYLON RV280 available from Toyobo Co., Ltd.; the amount of ionic group, 120 eq/ton) and an isocyanate cross-linking agent (CORONATE L available from Nippon Polyurethane Industry Co., Ltd.) were mixed with methyl ethyl ketone and toluene as solvents in the mixing ratio shown in Table 1 to give a coating solution. The coating solution prepared was then coated on a polyester resin film (COSMOSHINE A4350 available from Toyobo Co., Ltd.) of 188 μm in thickness by the bar coat method. Wire bar No. 3 was used. The coated film was subjected to heat treatment at 130° C. for 30 minutes. The coating thickness was 0.08 μm.

On the coating side of the coated plastic film, an indium-tin composite oxide thin film of 300 Å in thickness having 10 wt % tin oxide content was formed as a transparent conductive thin film by the DC magnetron sputtering method using an indium-tin composite oxide as a target. At that time, the degree of vacuum was set to $1\times10^{-3}$ Torr, and Ar and $O_2$ gases were flowed at 60 and 2 seem, respectively. During the film formation, the temperature of the substrate film was set to 5° C. The electric power applied to the target was set to 1.8 $W/cm^2$.

This transparent conductive film was used as one of the panel sheets, and a sheet having a glass substrate and a transparent conductive thin film of 400Å in thickness, which had been formed on the glass substrate by the same method as described above, was used as the other panel sheet. These two panel sheets were disposed with epoxy beads of 30 μm in diameter interposed therebetween so that the transparent conductive thin films were opposite to each other, giving a touch panel.

Example 5

The transparent conductive thin films as laminates with a polyester film/polyester resin cross-linked layer/indium-tin composite oxide thin film structure, which had been prepared in the same manner as described in Example 4, were irradiated with three UV lamps of 25 W using a UV ozone washing machine (OC-250315G available from Eye Graphics Co., Ltd.). The time of irradiation was set to 15, 30, or 60 seconds as shown in Table 2.

Each of these transparent conductive films thus subjected to UV ozone treatment was used as one of the panel sheets, and a sheet having a glass substrate and a transparent conductive thin film of 400 Å in thickness, which had been formed on the glass substrate by the same method as described above, was used as the other panel sheet. These two panel sheets were disposed with epoxy beads of 30 μm in diameter interposed therebetween so that the transparent conductive thin films were opposite to each other, giving a touch panel.

Example 6

Three laminates with a polyester film/polyester resin cross-linked layer/indium-tin composite oxide thin film structure, which had been prepared in the same manner as described in Example 4, were immersed in a washing solution containing 10 parts of an alkaline detergent (SCAT 20-X available from Dai-ichi Kogyo Seiyaku Co., Ltd.) and 90 parts of pure water with the time of immersion being changed to 10, 20, or 30 seconds as shown in Table 2, and then rinsed by immersion in pure water for 1 minute. The laminates were taken out of the pure water, and nitrogen gas was blown on the laminates to remove the moisture so that no spots were left.

Each of these transparent conductive films thus subjected to alkali washing treatment was used as one of the panel sheets, and a sheet having a glass substrate and a transparent conductive thin film of 400 Å in thickness, which had been formed on the glass substrate by the same method as described above, was used as the other panel sheet. These two panel sheets were disposed with epoxy beads of 30 μm in diameter interposed therebetween so that the transparent conductive thin films were opposite to each other, giving a touch panel.

Example 7

On the polyester resin cross-linked layer of a laminate with a polyester film/polyester resin cross-linked layer structure, which had been prepared in the same manner as described in Example 4, an indium-tin composite oxide thin film of 300 Å in thickness was formed as a transparent conductive thin film by the DC magnetron sputtering method using various indium-tin composite oxides as targets. At that time, indium-tin composite oxide targets having 15, 25, 35, 45, and 55 wt % tin oxide contents were used. The indium-tin composite oxide thin films obtained using the respective targets had 14, 23.5, 32.5, 42, and 51 wt % tin oxide contents, respectively. The degree of vacuum was set to $3\times10^{-3}$ Torr, and Ar and $O_2$ gases were flowed at 60 and 1 sccm, respectively. During the film formation, the temperature of the substrate film was set to 5° C. The electric power applied to the targets was set to 1.5 $W/cm^2$.

Each of these transparent conductive films was used as one of the panel sheets, and a sheet having a glass substrate and a transparent conductive thin film of 400 Å in thickness, which had been formed on the glass substrate by the same method as described above, was used as the other panel sheet. These two panel sheets were disposed with epoxy beads of 30 μm in diameter interposed therebetween so that the transparent conductive thin films were opposite to each other, giving a touch panel.

Example 8

On the polyester resin cross-linked layer of a laminate with a polyester film/polyester resin cross-linked layer structure, which had been prepared in the same manner as described in Example 4, an indium-tin composite oxide thin film of 300 Å in thickness was formed as a transparent conductive thin film by the DC magnetron sputtering method using an indium-tin composite oxide target having 45 wt % tin oxide content. The tin oxide content of the indium-tin composite oxide thin film was 42.5 wt %. The degree of vacuum was set to $3\times10^{-3}$ Torr, and Ar and $O_2$ gases were flowed at 60 and 1 sccm, respectively. During the film formation, the temperature of the substrate film was set to 5° C. The electric power applied to the target was set to 1.5 $W/cm^2$.

Further, on one side of the transparent polyester film, which side was in reverse to the other side having the transparent conductive thin film formed thereon, there was provided a hard coat treatment layer (HC). As a hard coat agent, an ultraviolet hardenable resin composition containing 100 parts of an epoxy acrylic resin and 4 parts of benzophenone added thereto was used, and a layer was formed by the reverse coat method, then predried at 80° C. for 5 minutes, and hardened by irradiation of ultraviolet rays at 500 mJ/cm$^2$. The thickness after the hardening was 5 μm.

This transparent conductive film was used as one of the panel sheets, and a sheet having a glass substrate and a transparent conductive thin film of 400 Å in thickness, which had been formed on the glass substrate by the same method as described above, was used as the other panel sheet. These two panel sheets were disposed with epoxy beads of 30 μm in diameter interposed therebetween so that the transparent conductive thin films were opposite to each other, giving a touch panel.

Example 9

On the polyester resin cross-linked layer of a laminate with a polyester film/polyester resin cross-linked layer structure, which had been prepared in the same manner as described in Example 4, an indium-tin composite oxide thin film of 300 Å in thickness was formed as a transparent conductive thin film by the DC magnetron sputtering method using an indium-tin composite oxide target having 40 wt % tin oxide content. The tin oxide content of the indium-tin composite oxide thin film was 35.0 wt %. The degree of vacuum was set to 3×10$^{-3}$ Torr, and Ar and O$_2$ gases were flowed at 60 and 1.5 sccm, respectively. During the film formation, the temperature of the substrate film was set to 5° C. The electric power applied to the target was set to 1.5 W/cm$^2$. During the film formation, the temperature of the substrate film was set to 5° C.

Further, on one side of the transparent polyester film, which side was in reverse to the other side having the transparent conductive thin film formed thereon, there was provided a anti-glare treatment layer (HC). As a coat agent, an ultraviolet hardenable resin composition containing 100 parts of an epoxy acrylic resin and 5 parts of benzophenone added thereto was used, and a layer was formed by the reverse coat method, then pre-dried at 80° C. for 5 minutes, given unevenness on the surface thereof by embossing rolls, and hardened by irradiation of ultraviolet rays at 500 mJ/cm$^2$ to form a hard coat layer having anti-glare effects. The thickness after the hardening was 5 μm.

This transparent conductive film was used as one of the panel sheets, and a sheet having a glass substrate and a transparent conductive thin film of 400 Å in thickness, which had been formed on the glass substrate by the same method as described above, was used as the other panel sheet. These two panel sheets were disposed with epoxy beads of 30 μm in diameter interposed therebetween so that the transparent conductive thin films were opposite to each other, giving a touch panel.

Example 10

On the polyester resin cross-linked layer of a laminate with a polyester film/polyester resin cross-linked layer structure, which had been prepared in the same manner as described in Example 4, an indium-tin composite oxide thin film of 300 Å in thickness was formed as a transparent conductive thin film by the DC magnetron sputtering method using an indium-tin composite oxide target having 35.0 wt % tin oxide content. The tin oxide content in the indium-tin composite oxide thin film was 35.0 wt %. The degree of vacuum was set to 3×10$^{-3}$ Torr, and Ar and O$_2$ gases were flowed at 60 and 1.5 sccm, respectively. During the film formation, the temperature of the substrate film was set to 5° C. The electric power applied to the target was set to 1.5 W/cm$^2$. During the film formation, the temperature of the substrate film was set to 5° C.

The plastic film was further provided with a anti-reflection treatment layer. As a hard coat agent, an ultraviolet hardenable resin composition containing 100 parts of an epoxy acrylic resin and 4 parts of benzophenone added thereto was used, and a layer was formed by the reverse coat method, then pre-dried at 80° C. for 5 minutes, and hardened by irradiation of ultraviolet rays at 500 mJ/cm$^2$. The thickness after the hardening was 5 μm. On this hard coat layer, there were provided a layer of Y$_2$O$_3$ having a thickness of 730 Å and a refractive index of 1.89, a layer of TiO$_2$ having a thickness of 1200 Å and a refractive index of 2.3, and a layer of SiO$_2$ having a thickness of 940 Å and a refractive index of 1.46 in this order by the sputtering method for low reflection treatment. At the time of forming the respective dielectric thin films, the degree of vacuum was set to 1×10$^{-3}$ Torr, and Ar and O$_2$ gases were flowed at 55 and 5 sccm, respectively. During the film formation, the temperature was kept at room temperature without heating or cooling.

This transparent conductive film was used as one of the panel sheets, and a sheet having a glass substrate and a transparent conductive thin film of 400 Å in thickness, which had been formed on the glass substrate by the same method as described above, was used as the other panel sheet. These two panel sheets were disposed with epoxy beads of 30 μm in diameter interposed therebetween so that the transparent conductive thin films were opposite to each other, giving a touch panel.

Comparative Example 1

A transparent conductive film was prepared in the same manner as described in Example 1, except that no polyester resin cross-linked layer was formed. This transparent conductive film was used to prepare a touch panel in the same manner as described in Example 1.

Comparative Example 2

A transparent conductive film was prepared in the same manner as described in Example 1, except that a polyester resin (VYLON RV200 available from Toyobo Co., Ltd.; the amount of ionic group, 0 eq/ton) was used. This transparent conductive film was used to prepare a touch panel in the same manner as described in Example 1.

Comparative Example 3

A transparent conductive film was prepared in the same manner as described in Example 1, except that no isocyanate cross-linking agent was added. This transparent conductive film was used to prepare a touch panel in the same manner as described in Example 1.

Comparative Example 4

On one side of a biaxially oriented polyethylene terephthalate film of 188 μm in thickness, which was the same as used in Example 1, there was applied a solution of an organosilicon compound in a mixed alcohol of butanol and isopropanol (concentration, 1 wt %), followed by drying at 100° C. for 1 minute. After that, on the organosilicon compound, a film was formed at a substrate temperature of 120° C. using an indium-tin composite oxide target having 5 wt % tin oxide content. The degree of vacuum was 2×10$^{-3}$ Torr, and Ar and O$_2$ gases were flowed at 50 and 1 sccm, respectively. To the target, a voltage of 350 V was applied with a current of 2 A, and the other conditions were the same as described in Example 5. After the film formation, heat treatment was further carried out at 150° C. for 10 hours. This transparent conductive film was used to prepare a touch panel in the same manner as described in Example 1.

The coat agent compositions used in Examples 1–4 and Comparative Examples 2, 3 were measured for the amount of ionic group in the polyester resins by the method as described below, and the results, together with the amounts of ingredients contained in each composition, are shown in Table 1. The transparent conductive films were measured for composition analysis of transparent conductive thin films, etching time for transparent conductive thin films, electron beam diffraction of transparent conductive thin films, light transmittance, surface tension of transparent conductive thin films, surface resistance of transparent conductive thin films, adhesion of transparent conductive thin films, and adhesion properties of transparent conductive thin films to silver paste by the methods as described below, and the results are shown in Tables 2 and 3. The touch panels prepared using the transparent conductive films of Examples 1–4 and Comparative Example 1 were tested for durability to input with a pen.

(1) Amount of Ionic Group

First, 0.2 g of a resin was dissolved in 20 ml of chloroform, and the solution was then titrated with a 0.1N ethanolic KOH solution to determine the equivalent weight per $10^6$ g (1 ton) resin (eq/ton).

(2) Composition Analysis of Transparent Conductive Thin Films

The "wt %" of tin oxide in the indium-tin composite oxide thin film refers to the value calculated from the composition of indium and tin in the thin film, which had been determined by the atomic absorption spectrometry, using the specific gravity of $In_2O_3$ and $SnO_2$ (7.18 for $In_2O_3$ and 6.95 for $SnO_2$) on the assumption that the indium and the tin were present as complete oxides in the thin film.

(3) Etching Time for Transparent Conductive Thin Films

A tester was connected to both ends of a transparent conductive film cut into a size of 10 cm×1 cm, and while measuring the resistance, the film was immersed in a 20% aqueous sulfuric acid solution at 40° C., and the time when the resistance reached 10 MΩ or higher was considered as the etching time (seconds).

(4) Electron Beam Diffraction of Transparent Conductive Thin Films

To obtain a single film of a transparent conductive thin film separated by the dissolution of a plastic film and a hardenable polymer hardened layer, a transparent conductive film was immersed in 1,1,1,3,3,3-hexafluoro-isopropanol for 2 days. The transparent conductive thin film in the solution was placed on a micro-grid, and air dried to remove the solution for 1 day. An electron beam diffraction image of this sample was obtained with a transmission-type electron microscope (JEM-2010 available from JEOL Ltd.). The conditions of electron beams were 200 kV for acceleration voltage and 0.0025 nm for wavelength. From this diffraction image, it was determined whether the transparent conductive thin film was crystalline or amorphous.

(5) Light Transmittance

The measurement was carried out by the integrating sphere-type light transmittance method according to JIS K 7105. A measuring device used was NDH-1001DP available from Nippon Denshoku Industries Co., Ltd.

(6) Surface Tension

The angle of contact, $\theta_w$, of water having the already known surface tension with a transparent conductive thin film, and the angle of contact, $\theta_y$, of methylene iodide with the transparent conductive thin film were measured under the conditions of 25° C. and 50% RH using a contact angle meter (model CA-X available from Kyowa Interface Science Co., Ltd.). Using these measurement values, the surface tension $\gamma_s$ of the transparent conductive thin film was calculated as follows:

The surface tension $\gamma_s$ of the transparent conductive thin film is the sum of dispersion component $\gamma_{sd}$ and polar component $\gamma_{sp}$, i.e., $$\gamma_s = \gamma_{sd} + \gamma_{sp} \tag{Eq. 1}$$

From the Young's equation, $$\gamma_s = \gamma_{sw} + \gamma_w \cdot \cos \theta_w \tag{Eq. 2}$$

$$\gamma_s = \gamma_{sy} + \gamma_y \cdot \cos \theta_y \tag{Eq. 3}$$

where $\gamma_{sw}$ is the tension acting between the transparent conductive thin film and water, $\gamma_{sy}$ is the tension acting between the transparent conductive thin film and methylene iodide, $\gamma_w$ is the surface tension of water, and $\gamma_y$ is the surface tension of methylene iodide. From the Fowkes' equation, $$\gamma_{sw} = \gamma_s + \gamma_w - 2 \times (\gamma_{sd} \cdot \gamma_{wd})^{1/2} - 2 \times (\gamma_{sp} \cdot \gamma_{wp})^{1/2} \tag{Eq. 4}$$

$$\gamma_{sy} = \gamma_s + \gamma_y - 2 \times (\gamma_{sd} \cdot \gamma_{yd})^{1/2} - 2 \times (\gamma_{sp} \cdot \gamma_{yp})^{1/2} \tag{Eq. 5}$$

where $\gamma_{wd}$ is the dispersion component of the surface tension of water, $\gamma_{wp}$ is the polar component of the surface tension of water, $\gamma_{yd}$ is the dispersion component of the surface tension of methylene iodide, and $\gamma_{yp}$ is the polar component of the surface tension of methylene iodide.

Solving the simultaneous equations of Eqs. 1 to 5, the surface tension of the transparent conductive thin film, i.e., $\gamma_s = \gamma_{sd} + \gamma_{sp}$, can be calculated. In this case, the following values were used: the surface tension of water ($\gamma_w$), 72.8 dyne/cm; the surface tension of methylene iodide ($\gamma_y$), 50.5 dyne/cm; the dispersion component of the surface tension of water ($\gamma_{wd}$), 21.8 dyne/cm; the polar component of the surface tension of water ($\gamma_{wp}$), 51.0 dyne/cm; the dispersion component of the surface tension of methylene iodide ($\gamma_{yd}$), 49.5 dyne/cm; and the polar component of the surface tension of methylene iodide ($\gamma_{yp}$), 1.3 dyne/cm.

(7) Surface Resistance

The measurement was carried out by the four terminal method according to JIS K 7194. The measuring device used was Lotest AMCP-T400 available from Mitsubishi Petrochemical Co., Ltd.

(8) Measurement of Adhesion

A laminate for adhesion measurement was prepared by laminating an ionomer film of 40 μm in thickness (HM-07 available from Tamapoly Co., Ltd.) onto a polyethylene terephthalate film of 75 μm in thickness (E5100 available from Toyobo Co., Ltd.) with a polyester-type adhesive (TAKENATE A310/TAKELAC A-3 available from Takeda Chemical Industries, Ltd.). The ionomer side of this laminate for adhesion measurement was placed opposite to the transparent conductive thin film side of a transparent conductive film, followed by heat-and-pressure bonding for 2 seconds under the conditions of 130° C. and 5 kg/cm². This laminate was then separated by peeling into the laminate for adhesion measurement and the transparent conductive film by the 180° peeling method, and the peeling force at that time was considered as the adhesion. The peeling speed at that time was 1000 mm/min.

(9) Adhesion Properties to Silver Paste

Using a screen mesh (200 mesh/inch) made of stainless steel, silver paste (DW-250H-5 available from Toyobo Co., Ltd.) was applied onto a transparent conductive thin film, followed by baking at 120° C. for 30 minutes. The silver paste after the baking had a thickness of 20 μm. The adhesion properties of the transparent conductive thin film to the silver paste was measured for 5 test pieces by the cross-cut adhesion method according to JIS D 0202, and their average value was calculated.

(10) Test for Durability to Input with a Pen

First, the measurement of linearity prior to the test for input with a pen was carried out as follows:

Each of the transparent conductive films of the present invention was cut into a size of 100 mm×100 mm, and at both ends on the side of each transparent conductive film having a transparent conductive thin film formed thereon, electrodes of 5 mm in width were formed by the application of silver paste. A voltage of 5 V was applied to these electrodes with a constant voltage power supply, and the voltage $V_{i,j}$ (where i, j=1 to 50) was measured at 2500 points extending from $(x_1, y_1)$ to $(x_{50}, y_{50})$ at an interval of 1 mm in the longitudinal and transverse directions over an area of 50 mm×50 mm in the center portion of a sample.

A deviation from the ideal voltage $U_{i,j}=V_{1,1}+(V_{50,50}-V_{1,1})/50 \times (j-i)$ at each point for voltage measurement was defined as $\Delta_{i,j}=(V_{i,j}-U_{i,j})/U_{i,j}$, and the maximum absolute value of $\Delta_{i,j}$ was defined as linearity.

Using the transparent conductive films measured for linearity prior to the test for input with a pen, touch panels were prepared as described in Examples and Comparative Examples. The test for input with a pen was carried out by writing katakana characters "ア" to "ン" in 2 cm square size at the sites employed for linearity measurement from the panel sheet side having each transparent conductive film using a plotter (DXY-1150 available from Roland Corporation) with a touch pen having a pen point of 0.8 mm in radius, which pen point was made of a polyacetal resin. In this case, a load of 250 gf was applied to the pen, and the speed of writing characters was set to 2000 characters/hour.

The transparent conductive films were removed from the touch panels after completion of the writing, and then measured for linearity after the test for input with a pen by the same procedures as described above. Such a evaluation was carried out in various numbers of written characters, and the number of characters at the time when linearity exceeded 3% was considered as the number of characters for durability to input with a pen (the number of times for durability to input with a pen).

TABLE 1

| | Polyester resin | | | | |
|---|---|---|---|---|---|
| | amount of ionic group (eq/ton) | (wt %) | Cross-linking agent (wt %) | Methyl ethyl ketone (wt %) | Toluene (wt %) | Cyclo-hexanone (wt %) |
| Example 1 | 120 | 2.5 | 2.0 | 67.0 | 28.5 | — |
| Example 2 | 50 | 2.0 | 1.5 | 67.0 | 29.5 | — |
| Example 3 | 340 | 1.0 | 0.8 | 65.0 | 25.0 | 8.2 |
| Example 4 | 120 | 0.8 | 0.7 | 65.0 | 25.0 | 8.5 |
| Comp. Ex. 2 | 0 | 2.5 | 2.0 | 67.0 | 28.5 | — |
| Comp. Ex. 3 | 120 | 2.5 | 0 | 68.4 | 29.1 | — |

TABLE 2

| | Treatment of transparent conductive thin films | | | | | |
|---|---|---|---|---|---|---|
| | UV ozone treatment time | alkaline detergent immersion time | Tin oxide content (wt %) | Thickness of resin layer (μm) | Etching time (seconds) | Crystallinity |
| Example 1 | — | — | 5.0 | 0.30 | 8 | amorphous |
| Example 2-1 | — | — | 5.0 | 0.12 | 8 | amorphous |
| Example 2-2 | — | — | 5.0 | 0.25 | 8 | amorphous |
| Example 3 | — | — | 10.0 | 0.12 | 12 | amorphous |
| Example 4 | — | — | 10.0 | 0.08 | 12 | amorphous |
| Example 5-1 | 15 seconds | — | 10.0 | 0.08 | 10 | amorphous |
| Example 5-2 | 30 seconds | — | 10.0 | 0.08 | 10 | amorphous |
| Example 5-3 | 60 seconds | — | 10.0 | 0.08 | 10 | amorphous |
| Example 6-1 | — | 10 seconds | 10.0 | 0.08 | 10 | amorphous |
| Example 6-2 | — | 20 seconds | 10.0 | 0.08 | 10 | amorphous |
| Example 6-3 | — | 30 seconds | 10.0 | 0.08 | 10 | amorphous |
| Example 7-1 | — | — | 14.0 | 0.08 | 12 | amorphous |
| Example 7-2 | — | — | 23.5 | 0.08 | 18 | amorphous |
| Example 7-3 | — | — | 32.5 | 0.08 | 25 | amorphous |
| Example 7-4 | — | — | 42.0 | 0.08 | 30 | amorphous |
| Example 7-5 | — | — | 51.0 | 0.08 | 50 | amorphous |
| Example 8 | — | — | 42.5 | 0.08 | 35 | amorphous |
| Example 9 | — | — | 35.0 | 0.08 | 27 | amorphous |
| Example 10 | — | — | 35.0 | 0.08 | 28 | amorphous |
| Comp. Ex. 1 | — | — | 5.0 | — | 8 | amorphous |
| Comp. Ex. 2 | — | — | 5.0 | 0.30 | 8 | amorphous |
| Comp. Ex. 3 | — | — | 5.0 | 0.30 | 8 | amorphous |
| Comp. Ex. 4 | — | — | 5.0 | 0.30 | 800 | crystalline |

TABLE 3

|  | Surface tension (dyne/cm) | Light transmittance (%) | Surface resistance (Ω/□) | Adhesion of transparent conductive thin film (g/15 mm) | Adhesion properties to silver paste | Number of times for durability to input with a pen (×10$^4$ times) |
|---|---|---|---|---|---|---|
| Example 1 | 28 | 87 | 220 | 38 | 65/100 | 12 |
| Example 2-1 | 27 | 87 | 215 | 42 | 60/100 | 14 |
| Example 2-2 | 27 | 87 | 215 | 40 | 60/100 | 13 |
| Example 3 | 33 | 87 | 225 | 40 | 75/100 | 13 |
| Example 4 | 33 | 87 | 220 | 42 | 75/100 | 14 |
| Example 5-1 | 45 | 87 | 220 | 42 | 98/100 | 14 |
| Example 5-2 | 60 | 87 | 223 | 42 | 100/100 | 14 |
| Example 5-3 | 71 | 87 | 225 | 41 | 100/100 | 13 |
| Example 6-1 | 45 | 87 | 220 | 42 | 95/100 | 14 |
| Example 6-2 | 48 | 87 | 225 | 40 | 96/100 | 14 |
| Example 6-3 | 51 | 87 | 225 | 40 | 100/100 | 15 |
| Example 7-1 | 37 | 87 | 300 | 43 | 90/100 | 14 |
| Example 7-2 | 39 | 87 | 360 | 45 | 93/100 | 14 |
| Example 7-3 | 41 | 86 | 430 | 47 | 95/100 | 15 |
| Example 7-4 | 46 | 86 | 560 | 50 | 95/100 | 16 |
| Example 7-5 | 53 | 85 | 780 | 52 | 98/100 | 17 |
| Example 8 | 47 | 86 | 570 | 51 | 90/100 | 15 |
| Example 9 | 40 | 86 | 450 | 48 | 94/100 | 16 |
| Example 10 | 43 | 89 | 450 | 48 | 95/100 | 16 |
| Comp. Ex. 1 | 31 | 87 | 225 | 7 | 65/100 | 8 |
| Comp. Ex. 2 | 31 | 87 | 220 | 9 | 50/100 | 7 |
| Comp. Ex. 3 | 30 | 87 | 260 | 25 | 55/100 | 5 |
| Comp. Ex. 4 | 32 | 86 | 380 | 55 | 65/100 | 15 |

BRIEF DESCRIPTION OF THE DRAWINGS

Figure 2:
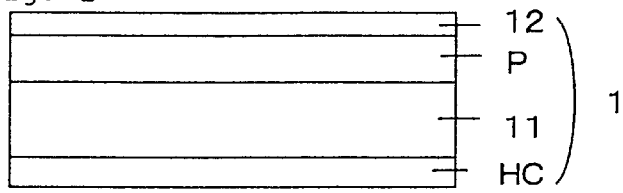
FIG. 2 shows a constitution of layers in the transparent conductive films of Example 8.
Figure 3:
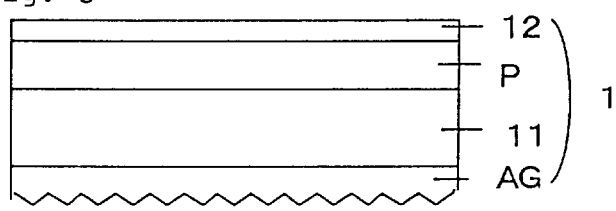
FIG. 3 shows a constitution of layers in the transparent conductive films of Examples 9.
Figure 4:
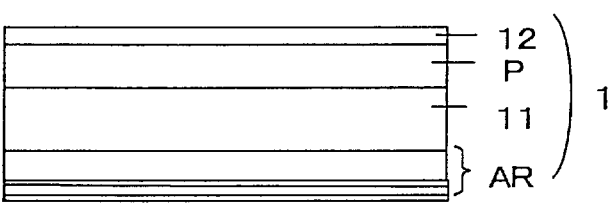
FIG. 4 shows a constitution of layers in the transparent conductive films of Examples 10.

FIG. 1 shows a constitution of layers in the transparent conductive films of Examples 1 to 7. FIG. 2 shows a constitution of layers in the transparent conductive films of Example 8. FIG. 3 shows a constitution of layers in the transparent conductive films of Examples 9. FIG. 4 shows a constitution of layers in the transparent conductive films of Examples 10. FIG. 5 shows a section of a touch panel utilizing a transparent conductive film of this invention.

Examples of Symbols

1 Transparent conductive film
2 Plastic film or glass sheet
3 Spacer
11 Plastic film
12 Transparent conductive thin film
P Ionic group containing resin layer
HC Hard coat treatment layer
AG Anti-glare treatment layer
AR Anti-reflection treatment layer

EFFECTS OF THE INVENTION

The transparent conductive films of the present invention have quite excellent conductivity, transparency, and etching characteristics. The touch panels using the transparent conductive films of the present invention exhibit quite excellent durability to input with a pen and are therefore useful. The films further have excellent adhesion properties to silver paste.

What is claimed is:

1. A transparent conductive film comprising a transparent plastic film and a transparent conductive thin film formed on at least one side thereof, characterized in that a polyester resin layer containing an ionic group in the range of 50 to 200 eq/ton is provided between the transparent plastic film and the transparent conductive thin film and the ionic group containing resin has a cross-linked structure, wherein said ionic group is selected from the groups consisting of: (1) sulfonic alkali metal salt groups, (2) sulfonic acid ammonium salt groups, (3) carboxylic acid alkali metal salt groups, (4) carboxylic acid ammonium salt groups, (5) sulfonic acid groups, phosphoric acid groups, phosphonic acid groups, phosphinic acid groups, and their ammonium salt groups and metal salt groups, and (6) primary, secondary, and tertiary amine groups.

2. The transparent conductive film according to claim 1 characterized in that the resin layer has a thickness of 0.005 to 0.2 μm.

3. The transparent conductive film according to claim 1, characterized in that the transparent conductive thin film has a surface tension of 35 to 60 dyne/cm.

4. The transparent conductive film according to claim 1, characterized in that the adhesion between the transparent conductive thin film and the substrate is 10 g/15 mm or greater.

5. The transparent conductive film according to claim 3 or 4, characterized in that the transparent conductive thin film is an indium-tin composite oxide thin film and the tin oxide content in the thin film is 10 to 60 wt %.

6. The transparent conductive film according to claim 1, characterized in that a hard coat treatment layer (HC) is provided on one side of the transparent conductive film, which side is in reverse to the other side having the transparent conductive thin film formed thereon.

7. The transparent conductive film according to claim 1, characterized in that an anti-glare treatment layer (AG) is laminated on one side of the transparent conductive film, which side is in reverse to the other side having the transparent conductive thin film formed thereon.

8. The transparent conductive film according to claim 1, characterized in that an anti-reflection treatment layer (AR) is laminated on one side of the transparent conductive film, which side is in reverse to the other side having the transparent conductive thin film formed thereon.

9. The transparent conductive film according to claim 1, characterized in that the substrate film is a polyester film.

10. The transparent conductive film according to claim 1, characterized in that the transparent conductive thin film is amorphous.

11. A touch panel comprising a pair of panel sheets having the transparent conductive thin films, which panel sheets are disposed so that the transparent conductive thin films are opposite to each other with a spacer interposed therebetween, characterized in that at least one of the panel sheets comprises the transparent conductive film as set forth in claim 1.

12. The touch panel according to claim 11, characterized in that the number of times for durability of the touch panel to input with a pen is 100,000 times or more.

* * * * *